United States Patent
Brunner et al.

(10) Patent No.: US 8,043,929 B2
(45) Date of Patent: Oct. 25, 2011

(54) SEMICONDUCTOR SUBSTRATE AND METHOD FOR PRODUCTION THEREOF

(75) Inventors: Josef Brunner, Reischach (DE); Hiroyuki Deai, Yamaguchi (JP); Atsushi Ikari, Yamaguchi (JP); Martin Grassl, Emmerling (DE); Atsuki Matsumura, Yamaguchi (JP); Wilfried von Ammon, Hochburg (AU)

(73) Assignee: Siltronic AG, Munich (DE)

( * ) Notice: Subject to any disclaimer, the term of this patent is extended or adjusted under 35 U.S.C. 154(b) by 688 days.

(21) Appl. No.: 12/120,285

(22) Filed: May 14, 2008

(65) Prior Publication Data
US 2008/0268613 A1    Oct. 30, 2008

Related U.S. Application Data

(62) Division of application No. 11/012,935, filed on Dec. 15, 2004, now abandoned.

(30) Foreign Application Priority Data

Dec. 25, 2003   (JP) ................................. 2003-430323
Oct. 28, 2004   (JP) ................................. 2004-314701

(51) Int. Cl.
*H01L 21/265*    (2006.01)
(52) U.S. Cl. . 438/407; 438/479; 438/480; 257/E21.563; 257/E21.561
(58) Field of Classification Search ........... 257/E21.563, 257/E21.561, 616, 347; 438/407, 479, 480
See application file for complete search history.

(56) References Cited

U.S. PATENT DOCUMENTS

| | | | |
|---|---|---|---|
| 4,975,387 | A | 12/1990 | Prokes et al. |
| 6,039,803 | A | 3/2000 | Fitzgerald et al. |
| 6,905,771 | B2 | 6/2005 | Ono et al. |
| 2001/0048119 | A1 | 12/2001 | Mizuno et al. |
| 2002/0022348 | A1 | 2/2002 | Sakaguchi et al. |
| 2003/0139000 | A1 | 7/2003 | Bedell et al. |
| 2003/0218189 | A1 | 11/2003 | Christiansen et al. |
| 2004/0002200 | A1 | 1/2004 | Koveshnikov |
| 2005/0003633 | A1 | 1/2005 | Mahle et al. |

FOREIGN PATENT DOCUMENTS

JP    2000-82679    3/2000

OTHER PUBLICATIONS

Tsutomu Tezuka et al., "A Novel Fabrication Technique of Ultra-Thin and Relaxed SiGe Buffer Layers With High GE Content for Sub-100 nm Strained Silicon-on-Insulator MOSFEs". Extended Abstracts of the 2000 International Conference on Solid State Devices and Materials, Japan Society of Applied Physics. Tokyo, Japan. vol. 20000. Aug. 20, 20000. pp. 472-473.

(Continued)

*Primary Examiner* — Colleen Matthews
(74) *Attorney, Agent, or Firm* — Brooks Kushman P.C.

(57) ABSTRACT

Hetero-semiconductor structures possessing an SOI structure containing a silicon-germanium mixed crystal are produced at a low cost and high productivity. The semiconductor substrates comprise a first layer formed of silicon having germanium added thereto, a second layer formed of an oxide and adjoined to the first layer, and a third layer derived from the same source as the first layer, but having an enriched content of germanium as a result of thermal oxidation and thinning of the third layer.

20 Claims, 2 Drawing Sheets

OTHER PUBLICATIONS

Shin-Ichi Takagi: "Strained-Si and SiGe-On-Insulator (Strained-SOI and SGOI) MOSFETs for High Performance/Low Power CMOS Application", Device Research Conference Digest. Jun. 24-26, 2002, Piscataway, N.J. USA, IEEE, Jun. 24, 2002, pp. 37-40.

Patent Abstract of Japan corres. to JP 06-252046.
Patent Abstract of Japan corres. to JP 10-308503.
Patent Abstract of Japan corres. to JP 09-321307.
Patent Abstract of Japan corres. to JP 2001-148473.
Patent Abstract of Japan corres. to JP 08-143389.
Patent Abstract of Japan corres. to JP 05-129201.

Fig. 5 ial application Ser. No. 11/012,935 filed Dec. 15, 2004 now abandoned and also claims priority to Japanese Application Nos. JP 2003-430323 filed Dec. 25, 2003 and JP 2004-314701 filed Oct. 28, 2004.

SEMICONDUCTOR SUBSTRATE AND METHOD FOR PRODUCTION THEREOF

This application is a division of and claims priority to U.S. application Ser. No. 11/012,935 filed Dec. 15, 2004 now abandoned and also claims priority to Japanese Application Nos. JP 2003-430323 filed Dec. 25, 2003 and JP 2004-314701 filed Oct. 28, 2004.

BACKGROUND OF THE INVENTION

1. Field of the Invention

This invention relates to a hetero-semiconductor structure possessing an SOI structure containing a silicon-germanium mixed crystal and a method for the production thereof at a low cost with high productivity.

2. Background Art

In recent years, a method for effecting high speed operation of MOSFET (Metal Oxide Semiconductor Field Effect Transistor) integrated circuits by utilizing a technique called "strained silicon" has been attracting attention. The strained silicon technique consists in enhancing the mobility of electrons or positive holes as the carrier in the channel of the MOSFET by utilizing a silicon layer deformed so as to increase the lattice constant.

To increase the lattice constant of the silicon layer used for the channel, numerous methods for disposing a silicon-germanium mixed crystal adjacent to the pertinent silicon layer have been proposed, as disclosed in JP-A 6-252046, for example. These conventional methods are characterized by depositing a silicon-germanium film by vapor phase deposition on a silicon wafer and thereafter depositing a silicon layer, again by vapor phase deposition. Since the lattice constant of germanium is 4% larger than that of silicon, by controlling the compositional ratio of silicon-germanium mixed crystal, it is possible to impart the necessary strain to the channel layer. More often than not, the proportion of germanium is selected to be in a range of 10-30 mol %.

This strained silicon technique may be used in combination with the so-called SOI (Silicon On Insulator) structure, this combination then known as SGOI (Silicon-Germanium On Insulator). The latter combination can be produced by bonding a first substrate prepared by depositing a multilayer film containing a silicon-germanium mixed layer by vapor phase deposition, and a second substrate furnished with an oxide film, and then removing the first substrate to a certain depth by polishing or etching, as disclosed in JP-A 10-308503. This technique is thus a combination of the SOI technique and the strained silicon technique. Combination with a SIMOX (Separated by IMplanted OXygen) technique (JP-A 4-264724), another typical method for the production of SOI wafers, has also been proposed. For example, a method for forming a buried oxide film in a silicon-germanium mixed crystal layer by depositing a silicon-germanium mixed crystal on a silicon substrate and thereafter implanting oxygen ions and subsequently subjecting the resultant composite to a high temperature heat treatment is proposed in JP-A 9-321307. JP-2001-148473 discloses a method for producing an SGOI wafer possessing a high germanium concentration by the so-called ITOX technique, i.e. by decreasing the thickness of the SOI film by oxidizing the film at high temperature, thereby increasing the germanium concentration in the SOI film.

U.S. Pat. No. 4,975,387 discloses a method for forming a silicon-germanium surface layer by depositing an amorphous silicon-germanium layer on a silicon substrate and oxidizing the resultant composite in an atmosphere of steam.

Production of silicon-germanium mixed crystals by the zone method from a silicon raw material doped with germanium has also been proposed. JP-A 8-143389, for example, discloses a method for forming a bulk single crystal by adjusting the germanium concentration in a liquid phase, thereby controlling the concentration of germanium in the solid phase. These conventional methods of production, however, have entailed numerous problems.

Specifically, when a technique such as that disclosed in JP-A 6-252046 is employed, the silicon-germanium mixed crystal layer intended to impart strain must be sufficiently relaxed until the lattice constant assumes a magnitude conforming to the inherent composition. The relaxation of lattice must be relied on for generation of dislocations. When the dislocation thus generated extends to the region used by the relevant device, it may induce the device to malfunction. Various measures have been proposed to safeguard against this danger. One of the methods, as disclosed in JP-A 6-252046 and JP-A 5-129201, comprises depositing a so-called graded buffer layer, i.e. a layer wherein the compositional ratio of germanium gradually increases during the formation of a silicon-germanium mixed crystal layer by vapor phase deposition, thereby preventing the dislocation from threading to the surface layer. Attaining the necessary compositional ratio of germanium by this technique necessarily results in deposition of thick films, markedly impairing productivity, and heightening the cost of production as a result. U.S. Pat. No. 6,039,803 discloses inclining the main orientation of the silicon substrate by 1-8 degrees from the normally adopted direction of <100>. However, even the use of this method cannot be expected to attain sufficient inhibition of dislocation, since this method entails the problem of requiring deposition of a graded buffer layer.

The combination of the SOI structure and the strained silicon technique which is disclosed in JP-A 9-321307 and JP-2001-148473 does not require formation of a thick silicon-germanium mixed crystal layer as described above. However, the process still requires deposition of a silicon-germanium mixed crystal layer, necessitating a complicated process of production, and heightening the cost of production.

A method for forming an epitaxial layer by depositing an amorphous silicon-germanium layer and subsequently oxidizing the deposited layer in an atmosphere of steam as disclosed in U.S. Pat. No. 4,975,387 requires a separate apparatus for the growth of the amorphous film. Most amorphous film forming devices are susceptible to contamination with impurities. This method, therefore, is not a satisfactory process for the production of wafers for use in high-speed devices desired for present and future production.

Growth of silicon-germanium mixed crystals by the Czochralski technique or by the zone melting technique disclosed in JP-A 8-143389 necessitates a large amount of a germanium raw material. Since the germanium raw material is expensive, the production of a crystal having such a high germanium concentration in the range of 10-30 mol % required for a strained silicon substrate has only little merit commercially. Further, an attempt to grow from a liquid phase a single crystal containing germanium at such a high concentration is technically difficult because growth tends to produce dislocations.

SUMMARY OF THE INVENTION

This invention proposes a wafer having a novel layer structure and a method for the production thereof with a view towards solving the problems mentioned above. The wafer of this invention has a layer on which the active region of the semiconductor device is formed and also the substrate, both made of silicon-germanium mixed crystals, but mixed crystals which are widely different in concentration. The wafer of this construction permits a strained silicon wafer of high quality to be produced at a low cost with high productivity.

DETAILED DESCRIPTION OF THE PREFERRED EMBODIMENT(S)

One embodiment of this invention is directed to a semiconductor substrate which is characterized by providing a first layer formed of silicon having germanium added thereto, a second layer formed of an oxide and adjoined to the first layer, and a third layer formed of a silicon-germanium mixed crystal and adjoined to the second layer. By using a silicon-germanium layer having a low germanium concentration in the place of the ordinary silicon layer in the first layer, it is possible to increase the quality of the third layer and a layer formed adjoining the third layer. It is further made possible to mass produce the second and third layers with enhanced quality at a low cost. Thus, this process results in an optimum technique for the production of strained silicon wafers possessing SOI and SGOI structures which are required by the semiconductor industry.

The invention is also directed toward a semiconductor substrate wherein the thickness of the first layer corresponds to the thickness of a wafer. This embodiment has all the advantages of the first embodiment of the invention and, at the same time, the first layer possesses sufficient mechanical strength to be used for handling the wafer.

The invention is further directed to a semiconductor substrate wherein the germanium concentration of the first layer is not less than 0.05 mol % and not more than 5 mol % and preferably not less than 0.2 mol % and not more than 1 mol %. By setting the germanium concentration during the growth of a single crystal at a level not lower than 0.05 mol %, it is possible to attain a germanium concentration sufficient for the production of a strained silicon wafer possessing an SGOI structure suitable for use as a high-speed device, while engendering excellent crystallinity as well. Yet, more favorable properties are obtained by setting the germanium concentration at a level of not lower than 0.2 mol %. If the germanium concentration exceeds 5 mol %, the overage will induce greater frequency of dislocations during crystal pulling and will thus render production of high quality crystals difficult. By maintaining a germanium concentration below 1 mol %, it is possible to facilitate the growth of crystal, obviate the necessity for using a large amount of the expensive germanium raw material, and reduce cost yet further.

In another embodiment, the invention is directed toward a semiconductor substrate wherein the first layer is a single crystal. It is thus made possible to further improve the quality of the mixed crystal of the third layer and thus more readily permit formation of high-speed semiconductor devices on the third layer and on a crystal layer further deposited on the third layer.

A yet further embodiment of the invention is directed to a semiconductor substrate wherein the second layer is formed of a silicon oxide which is an electrical insulator. Silicon oxide exhibits good insulating properties as compared with other oxides such as germanium oxide or silicon oxide containing germanium at the highest possible concentration. By forming the second layer with silicon oxide as an electrical insulator, it is possible to produce an SGOI wafer of high quality.

Another embodiment of the invention is directed to a semiconductor substrate wherein the thickness of the second layer is not less than 80 nm. By setting the thickness of the second layer at a level of not less than 80 nm, it is made possible to attain effective insulation and separation.

A still further embodiment of the invention is directed to a semiconductor substrate wherein the third layer is a single crystal. The third layer and a crystal layer subsequently deposited on the third layer facilitate the production of semiconductor devices.

The invention is also directed to a semiconductor substrate as previously disclosed, wherein the thickness of the third layer is not less than 1 nm and not more than 50 nm. If the third layer is less than 1 nm in thickness, the low thickness will render the production of the substrate technically difficult and will disrupt the stability with which an additional film is formed juxtaposed onto the third layer. Further, for the third layer, a silicon-germanium layer having a thickness exceeding 50 nm is neither necessary nor essential. By forming the third layer in a thickness of not less than 1 nm and not more than 50 nm, it is made possible to satisfy all the requirements for the semiconductor devices of the non-depletion type, partial depletion type, and full depletion type.

The invention is further directed to a semiconductor substrate wherein the germanium concentration of the third layer is not less than 15 mol % and is as much as 100 mol %. If the germanium concentration of the third layer is lower than 15 mol %, the low concentration will prevent the deposited strained silicon layer from acquiring sufficient strain. Due to the presence of germanium in the third layer, it is possible to form a semiconductor device structure either directly on the third layer or after the strained silicon layer has been formed adjoining the third layer. By increasing the germanium concentration of the third layer towards 100 mol %, it is possible to obviate the necessity of growing a germanium bulk single crystal at a very high cost, to form a semiconductor device directly on the third layer, and to utilize such advantages as very high carrier mobility, a narrow band gap, and good lattice conformity with III-V family compounds. The formation of the third layer possessing a germanium concentration approximating 100 mol % enables a 100 mol % germanium layer to be formed in a vapor phase thereon while the occurrence of dislocations by misfit is repressed. The present invention, therefore, enjoys free selection of the thickness of germanium crystal layer and, at the same time, gives rise to a substrate for the formation of a germanium MOS semiconductor.

The invention is also directed toward a semiconductor substrate wherein the first layer contains no COP. The term "COP" refers to minute hollow defects which are formed during the growth of a silicon single crystal and which are known to have adverse effects on a semiconductor device. To grow a crystal containing no COP, methods which cause a defect-free region to form throughout the entire surface of a wafer by lowering the speed of pulling a single crystal is known. The products produced by this method are known as so-called "perfect crystals." By using this wafer for the first layer, it is made possible to prevent the third layer from forming a defect therein.

In a yet further embodiment, the invention is directed to a semiconductor substrate characterized by the fact that the third layer contains no COP. As a result, the deposition of an additional layer in semiconductor fabrication processes results in a high yield of operable devices.

The invention is also directed to a semiconductor substrate characterized by a dislocation density reaching the surface of the third layer of not more than $1 \times 10^5$ pieces/cm$^2$.

Production of the most advanced SGOIs known to date relies on relaxation of the lattice of a heteroepitaxially grown layer. This method causes the density of dislocations reaching the device forming layer to increase. In contrast, the inventive wafer has no need for heteroepitaxial growth, and therefore achieves a low dislocation density which is a considerable advantage in the production of a semiconductor device.

The invention is also directed to a semiconductor substrate characterized by a roughness of the second layer of not more than 5 nm RMS over 40×40 μm. The inventive wafer has low surface roughness and thus does not require processing for further lowering roughness. This low roughness is an advantage in the production of semiconductor devices.

The invention is further directed to a semiconductor substrate characterized by a fluctuation in the thickness of the third layer of not more than 5%, or not more than 2.5 nm. The wafer of the invention exhibits good uniformity of layer thickness as compared with the most advanced methods of production known to date, which consist of forming a thin film on an oxide film. As a consequence of the increase in the germanium concentration of the third layer, the content of silicon is relatively decreased and the speed of oxidation is lowered. The variation of the rate of oxidation with time gradually reduces non-uniformity in the in-plane thickness and eventually converges to a uniform film thickness throughout the entire in-plane region. This invention utilizes this phenomenon, and the highly uniform thickness attained thereby allows the thickness of the film to be further decreased without impairing this uniformity. These characteristic properties benefit the production of a semiconductor device.

The invention is also directed to a semiconductor substrate characterized by a fluctuation of the germanium concentration in the third layer of not more than 5%. The subject invention wafers possess excellent in-plane uniformity of germanium concentration due to diffusion of germanium. This characteristic property, when a strained silicon layer is deposited on wafers such as those described in the first embodiment of the invention, enables uniform in-plane strain to be imparted to the deposited strained silicon layer.

The invention is further directed to a semiconductor substrate characterized by having a strained silicon layer adjoining the third layer. Owing to the excellent characteristics of the third layer mentioned above, it is possible to prepare a strained silicon wafer possessing an embedded insulating film with high quality at a low cost. The prominent quality and economy are indispensable to the production of various devices of the non-depletion type, partial depletion type, and full depletion type.

The wafer of the invention also comprises a semiconductor substrate, characterized by a first layer formed of silicon having germanium added thereto, a second layer formed of an oxide and adjoining the first layer, a third layer formed of a silicon-germanium mixed crystal having a higher concentration of germanium than in the first layer and adjoining the second layer, and a fourth layer formed of germanium. Such germanium substrates can be prepared by the process of the invention without requiring the growth of a germanium bulk crystal which entails high cost. The germanium can be formed as a fourth layer on the semiconductor directly, and can utilize advantages such as very high carrier mobility, narrow band gap, and excellent lattice doping with III-V group compounds. When a third layer having approximately 100 mol % germanium concentration is produced, generation of misfit dislocations is inhibited and at a 100 mol % germanium layer can be formed by vapor deposition. As a result, the thickness of germanium crystal can be freely selected and it may be used as a substrate for germanium MOS semiconductors.

The invention is also directed to a method for the production of a semiconductor substrate, comprising:

1) doping a silicon raw material with germanium and growing a single crystal by the Czochralski method or the zone melting method, 2) processing the single crystal into wafers, 3) implanting oxygen ions into the wafers by ion implantation, 4) forming a buried oxide film by high temperature heat treatment, and 5) thinning the crystal layer on the buried oxide film by thermal oxidation in an oxidizing atmosphere.

Figure 1:
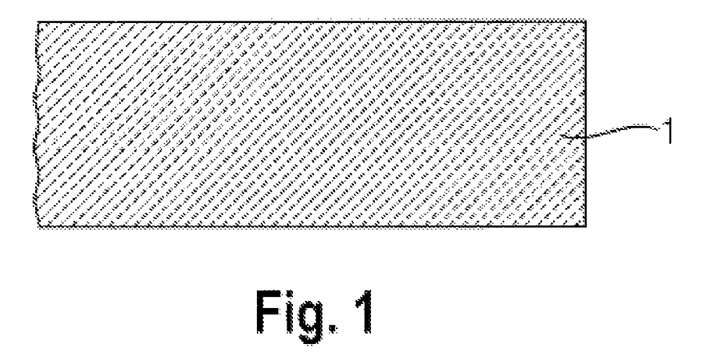
FIG. 1 illustrates a cross section of a single crystal silicon wafer having a content of 0.05 mol % to 5 mol % Ge.
Figure 2:
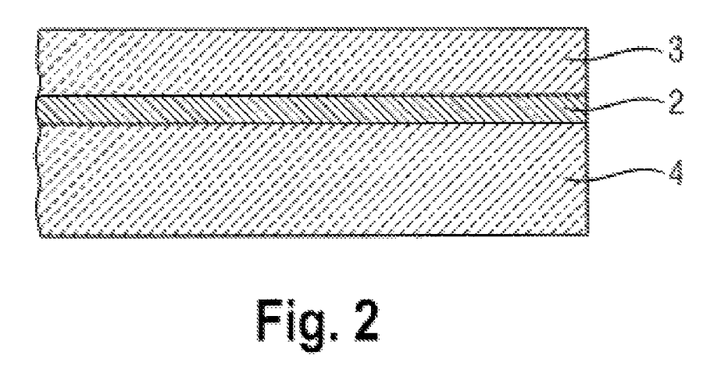
FIG. 2 illustrates the wafer of FIG. 1 where a buried insulating oxide layer divides the wafer into three regions.
Figure 3:
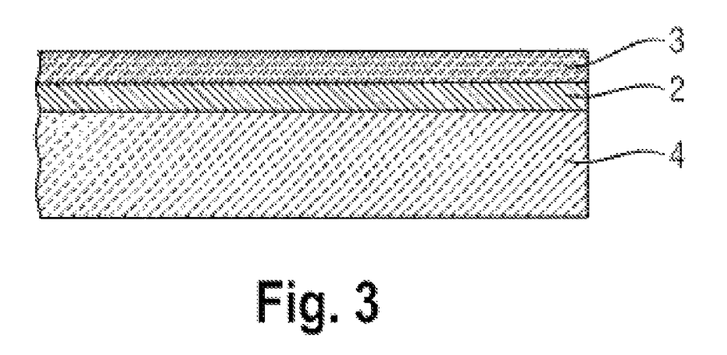
FIG. 3 illustrates the wafer of FIG. 2 where the Ge concentration of layer 1 has been concentrated by removing silicon, thus thinning the layer.
Figure 4:
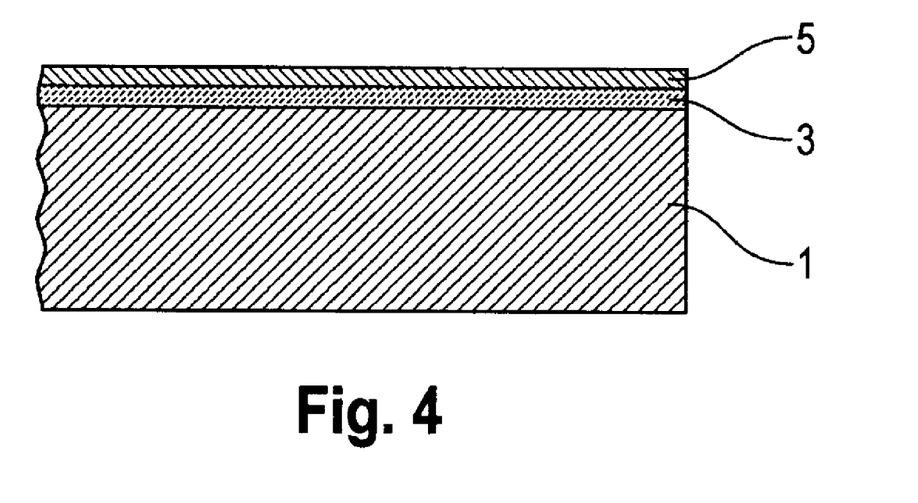
FIG. 4 illustrates an intermediate wafer in one embodiment of the invention wherein prior to formation of the buried oxide film of FIG. 2, an oxide film (5) is formed, resulting in a layer (3) of increased Ge concentration.
Figure 5:
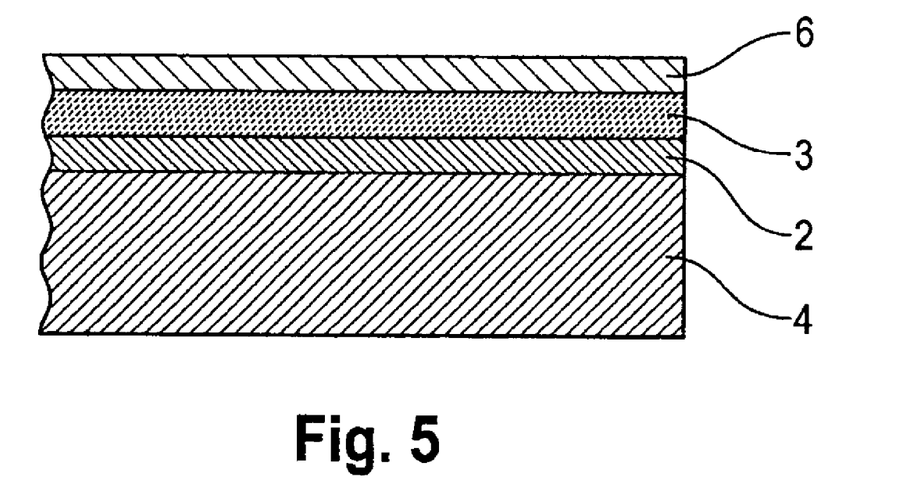
FIG. 5 illustrates an embodiment where a film (6) of Ge or strained Si is formed on the wafer of FIG. 3.

The process may be illustrated by FIGS. 1-4. In FIG. 1, the starting material is a silicon-germanium single crystal wafer 1 of uniform Si/Ge content sawn from a single crystal ingot, and having a germanium concentration of 0.05 mol % to 5 mol percent. The buried oxide film 2 is then formed, for example by the SIMOX process, separating (FIG. 2) the original wafer into a regions 3 and a region 4 having the same Si/Ge content as in the original wafer (FIG. 1), separated by an insulating film 2. The topmost layer is then thinned, removing Si in the process, to thin and enrich the Ge/Si concentration to a much higher Ge concentration of not less than 99 mol percent. (FIG. 3). Prior to the formation of the buried oxide film 2, the concentration of germanium near the surface "3", of said wafer is increased by oxidizing the wafer in an oxidizing atmosphere at elevate temperature, followed by removal of an oxide film 5 formed thereby (FIG. 4). Following formation of the wafer with topmost layer 3 of increased germanium concentration, a strained silicon or a germanium layer 6 may be deposited as shown in FIG. 5.

According to the invention, it is possible to form an SGOI structure with very high productivity and produce the inventive wafers easily without requiring CVD growth of a silicon-germanium layer. Since the process for epitaxial growth of a silicon-germanium layer can be omitted, such problems as dislocation and surface roughness, which are inherent in epitaxial growth, can be alleviated. Further, the lattice constant can be continuously varied while the occurrence of dislocations by misfit and threading dislocations which are detrimental to a semiconductor device is repressed. Since no need is found for the epitaxial growth of a silicon-germanium layer, the wafer excels in uniformity of film thickness and germanium concentration. Owing to this outstanding uniformity, a silicon-germanium layer having a decreased thickness of even less than 10 nm is able to retain in-plane uniformity and an extremely thin film SGOI structure which has never been technically attained by conventional methods. For the purpose of accomplishing a necessary germanium concentration, the concentration of germanium used for doping at step 1)

may be adjusted, and the decrease of film thickness may be achieved by an increase in concentration of germanium during step 5).

In the inventive process, semiconductor substrates may be obtained by thermally oxidizing the wafer in an oxidizing atmosphere after completion of step 2), followed by etching and cleaning the oxide film formed on the surface, and thereafter step 3) and the following steps are performed.

By thermally oxidizing a crystal doped with germanium at a comparatively low concentration, it is possible to increase the content of germanium to a high concentration in the surface layer portion of the crystal. In the thermal oxidation of a silicon-germanium mixed crystal, silicon is preferentially oxidized and the greater part of germanium atoms are diffused as a residue into the substrate crystal. Since the germanium in the silicon crystal has an extremely small diffusion coefficient, the germanium atoms are not diffused throughout the entire substrate but allowed to form an enriched silicon-germanium layer having germanium concentrated in the surface layer. The present invention, by utilizing this phenomenon, is able to form a silicon-germanium mixed crystal layer having a high germanium concentration easily and at a low cost. By utilizing the silicon-germanium layer thus formed and performing the so-called SIMOX process thereon, it is possible to produce an SGOI structure possessing a silicon-germanium layer of good quality in the surface layer, at a low cost, and with high productivity.

The semiconductor substrate may be oxidized by an oxidizing atmosphere which contains steam during the process of thermal oxidation. Generally, oxidation in an atmosphere of steam proceeds at high velocity and thus increases productivity, since it is capable of forming an oxide film in a short period of time and thus further prevents diffusion of the concentrated germanium on the surface into the bulk substrate. A layer of high germanium concentration is formed in the surface layer.

In the process of thermal oxidation using steam, the temperature is preferably not lower than 900° C. and not higher than the melting point, and the oxidation time is not less than 30 minutes. If the temperature during the oxidation falls much short of 900° C., the lower temperature will result in markedly lowering productivity because a long time is required for increasing the germanium concentration. For the purpose of obtaining a crystal of good quality, control of the highest temperature for the oxidizing step below the melting point is necessary. Since the melting point decreases as the germanium concentration increases, the upper limit of the temperature must be commensurate with the relevant concentration. Even when the melting point is relatively high, the oxidation temperature is preferred to be not higher than 1300° C. When the temperature exceeds 1300° C., the speed of diffusion of germanium increases and the concentrated germanium diffuses and vanishes into the substrate. Thus, no appreciable merit is brought by the further increase of the temperature. When the oxidizing time is less than 30 minutes, the concentration of germanium cannot be expected to be elevated to the desired level within the range of temperature mentioned above.

The process of concentration of germanium during the course of the thermal oxidation is described more specifically below. It is known that the thickness of the oxide film ("Tox") during thermal oxidation generally has the following relationship with the time, t.

$$Tox^2 + A \times Tox = B \times t,$$

wherein, B denotes the "parabolic velocity constant" which is determined by the temperature, pressure, and atmosphere during the oxidation. The distribution of germanium in the depth direction during the course of the oxidation can be calculated by the following formula.

$$\frac{\partial C}{\partial t} = D \frac{\partial^2 C}{\partial x^2} + 0.441 \frac{\partial Tox}{\partial t} \frac{\partial C}{\partial x},$$

wherein, C denotes the concentration of germanium, D the diffusion coefficient of germanium, x the depth from the interface between the surface oxide film and the crystal, and t, the time. On the assumption that all the germanium atoms in the silicon-germanium layer etched by oxidation are swept into the crystal side, the boundary condition at x=0 can be determined so as to conserve the total amount of germanium atoms in the crystal layer. The average germanium concentration in the surface layer having a thickness T1 (the layer of x=0–T1) can be approximately expressed as follows:

$$C_0 \left( 1 + \alpha \left( 1 - \mathrm{erf}(\beta) + \frac{1}{\beta \sqrt{\pi}} (1 - \exp(-\beta^2)) \right) \right),$$

wherein, $C_o$ denotes the initial germanium concentration prior to the oxidation and $\alpha$ and $\beta$ denote the following magnitudes.

$$\alpha = 0.39 \sqrt{\frac{B}{D}}, \ \beta = \frac{T_1}{2\sqrt{Dt}}$$

In accordance with this formula, the optimum time/temperature condition during the course of the oxidation can be found. When the time of oxidation is set at 8 hours, for example, temperatures of 1100-1150° C. are capable of increasing the germanium concentration most effectively. When the time of oxidation is set at 2 hours, a temperature of 1200° C. increases the concentration most effectively.

It is preferably that the oxide film formed by the process of thermal oxidation has a thickness of not less than 1 μm. By adjusting the thickness of the oxide film as mentioned above, it is possible to form a silicon-germanium layer having high germanium concentration sufficient for the SGOI wafer produced by the SIMOX process.

A strained silicon film may be deposited by the technique of vapor phase deposition onto a semiconductor substrate of the invention. It is possible to form a strained silicon film of good quality and increase the carrier mobility in the channel of the MOS device thereby.

By increasing the germanium concentration in the crystal layer above the buried oxide film to not less than 95 mol % by the steps previously disclosed, and further depositing a germanium film by the technique of vapor phase deposition, excellent germanium substrates for use in producing semiconductor devices are obtained. For example, when the third layer has a germanium concentration approaching 100 mol %, vapor phase deposition of a 100 mol % germanium layer thereon is possible, while the occurrence of dislocations by misfit is repressed. The thickness of the germanium crystal layer can be adjusted as desired, giving rise to a substrate useful for producing germanium MOS semiconductors.

The hetero-semiconductor structure containing a silicon-germanium mixed crystal and the method for the production thereof which are contemplated by this invention enable an SGOI structure to be formed with high quality at a low cost without requiring either the vapor phase deposition of a silicon-germanium crystal layer or the growth of an amorphous layer or a multi-crystal layer which has been used hitherto.

EXAMPLES

The preferred mode of embodying the present invention will be described in detail below. The germanium concentrations shown herein below are reported in mol %. These examples are illustrative and not limiting.

Example 1

Five single crystal bars having different compositional ratios of germanium were grown by the Czochralski technique using silicon and germanium as raw materials. Four of these single crystal bars were grown without dislocation, and were sliced, lapped, etched, polished, and cleaned in the same manner as ordinary silicon wafers to manufacture wafers for use in the test. One sample taken from each of these wafers was tested for germanium concentration by means of the SIMS (secondary ion mass spectroscopy). The results of this test and the presence or absence of dislocations after growth are summarized in Table 1.

TABLE 1

|  | Crystal 1 | Crystal 2 | Crystal 3 | Crystal 4 | Crystal 5 |
|---|---|---|---|---|---|
| Germanium concentration immediately after growth | 0.04 | 0.3% | 0.7% | 1.2% | 5.2% |
| Presence of dislocation immediately after growth | No | No | No | No | Yes |

Subsequently, the test wafers derived from Crystals 1-4 were individually oxidized in an atmosphere of steam at 1150° C. for 16 hours. The oxide films thus formed had a thickness of 3.1 μm. These samples were processed by the so-called low dose SIMOX process. Specifically, the samples were implanted with oxygen ions by the use of an ion implanter at a concentration of $4.0 \times 10^{11}$ atoms/cm$^2$ and the wafers were subsequently heat-treated in a mixed atmosphere of argon with a trace amount of oxygen at 1350° C. for 10 hours to induce formation of a buried oxide film. These wafers were further oxidized in an atmosphere containing oxygen so as to thin the crystal layer on the buried oxide film to 32 nm thickness. The oxidation was performed at a temperature not exceeding the melting point during the course of concentration, namely 1200° C. in the case of the wafers derived from Crystals 1-3 and 1100° C. in the case of the wafer derived from Crystal 4. The surface oxide films were removed from the wafers with dilute hydrofluoric acid. One sample each of the wafers was tested for germanium concentration in the SGOI layer, the surface crystal layer directly abutting the buried oxide film, by means of SIMS. The results are shown in Table 2.

TABLE 2

| Example 1 | | | | |
|---|---|---|---|---|
| Conditions of preoxidation | Atmosphere of steam, 1150° C., 16 hours | | | |
| Original crystal | Crystal 1 | Crystal 2 | Crystal 3 | Crystal 4 |
| Name of sample | Sample 1A | Sample 2A | Sample 3A | Sample 4A |
| Germanium concentration in 32 nm SGOI layer | 1.1% | 8.9% | 19.5% | 32.0% |

Generally, the SGOI process prefers a germanium concentration of not less than 15% from a practical point of view. Samples 3A and 4A were found to have high germanium concentrations. All the samples were found to have good in-plane distribution of germanium concentration, invariably within 5%. The samples were also tested for in-plane film thickness distribution with a spectroscopic ellipsometer. The test yielded good results; the fluctuation of film thickness was 2.8% and the difference between the largest and the smallest film thickness was 0.7 nm.

Subsequently, the samples produced were subjected to the AFM (atomic force microscopy) observation to determine the surface roughness. The RMS surface roughness was found to be 1.9 nm over a scanning range of 40×40 μm.

Next, a silicon layer of a film thickness of 15 nm was deposited on samples 3A by vapor phase deposition. The silicon layers thus deposited were tested for Raman scattering to determine the strains imparted therein. As a result, the silicon layer was found to contain strains theoretically commensurate with the pertinent germanium concentration. Thus, the strained silicon wafers consequently obtained were found to have good quality.

Further, to determine crystallinity, samples were subjected to cross sectioned TEM observation, which found no discernible dislocation by misfit in the strained silicon layer forming the uppermost surface layer and the silicon-germanium layer underlying it. The crystal layers obtained were found to have good quality.

The surface layer of about 0.5 μm in thickness of strained silicon was tested for threading dislocation density by the preferential etching technique. As a result, the sample was found to have $7 \times 10^4$ cm$^{-2}$ of threading dislocation density.

Example 2

The wafers derived from Crystals 1-4 grown in Example 1 were oxidized in the same atmosphere of steam as in Example 1 at 1150° C. for 16 hours and subjected to oxygen ion implantation and heat treatment for the formation of a buried oxide film. Subsequently, the crystal layers on the buried oxide films were thinned to 25 nm. After the formed oxide films were removed with hydrofluoric acid, the samples were individually tested for germanium concentration in the SGOI layer by means of SIMS. The results are shown in Table 3.

TABLE 3

| Example 2 | | | | |
|---|---|---|---|---|
| Conditions of preoxidation | Atmosphere of steam, 1150° C., 16 hours | | | |
| Original crystal | Crystal 1 | Crystal 2 | Crystal 3 | Crystal 4 |
| Name of sample | Sample 1A' | Sample 2A' | Sample 3A' | Sample 4A' |

TABLE 3-continued

Example 2

| Conditions of preoxidation | Atmosphere of steam, 1150° C., 16 hours | | | |
|---|---|---|---|---|
| Germanium concentration in 25 nm SGOI layer | 1.3% | 11.7% | 26.2% | 43.1% |

As a result, it was found that not only Crystals 3 and 4 but also Crystal 2 having a comparatively low initial germanium concentration was capable of forming an SGOI layer of a very high germanium concentration.

Subsequently, on the sample 3A', a silicon layer having a film thickness of 15 nm was deposited by vapor phase deposition. The silicon layer thus deposited was tested by Raman scattering to investigate the strain in the silicon layer. The silicon layer was found to contain strain in nearly theoretical amounts. Thus, the strained silicon wafers were of good quality.

The sample was further subjected to cross sectional observation by TEM and selective etching. The observation found no discernible dislocation by misfit in the strained silicon layer forming the uppermost surface layer and the silicon-germanium layer underlying it. The sample was found to have $9 \times 10^4$ cm$^{-2}$ respectively of threading dislocation density.

Example 3

The wafers derived from Crystals 1-4 which could be grown without dislocation in Example 1 were oxidized in an atmosphere of steam at 1200° C. for 2 hours. The formed oxide film had a thickness of 0.9 μm. These samples were subjected to oxygen ion implantation and heat treatment for the formation of a buried oxide film under the same conditions as mentioned above. Subsequently, the crystal layers on the buried oxide films were thinned to 25 nm. The temperature of oxidation during the course of thinning the film was the same as in Example 1. After the formed oxide films were removed with hydrofluoric acid, the samples were tested for germanium concentration of the SGOI layer by means of SIMS. The results are shown in Table 4.

TABLE 4

Example 3

| Conditions of preoxidation | Atmosphere of steam, 1200° C., 2 hours | | | |
|---|---|---|---|---|
| Original crystal Name of sample | Crystal 1 Sample 1B | Crystal 2 Sample 2B | Crystal 3 Sample 3B | Crystal 4 Sample 4B |
| Germanium concentration in 25 nm SGOI layer | 0.5% | 4.0% | 9.1% | 15.5% |

As a result, samples 1B, 2B, and 3B manufactured from Crystals 1, 2, and 3 were found to have rather insufficient germanium concentrations, while sample 4B manufactured from Crystal 4 was capable of acquiring a silicon-germanium layer having a sufficiently high germanium concentration. The fluctuation of concentration was within 5%. The fluctuation of film thickness was 2.4% and the difference between the largest and the smallest film thickness was 0.6 n, a satisfactory magnitude. When the samples were tested for surface roughness in the same manner as in Example 1, the RMS was found to be 1.5 nm.

Subsequently, on sample 4B, a silicon layer having a film thickness of 15 nm was deposited by vapor phase deposition. The silicon layer thus deposited was tested by Raman scattering to investigating strain in the silicon layer. The silicon layer was found to contain a nearly theoretical amount of strain. Thus, a strained silicon wafer of good quality could be manufactured.

Further, the sample was subjected to surface TEM observation and selective etching. The observation found no discernible dislocation by misfit in the strained silicon layer forming the uppermost surface layer and the silicon-germanium layer underlying it. The threading dislocation density was found to be $3 \times 10^4$ cm$^{-2}$.

Comparative Example 1

The wafers derived from the same Crystals 1-4 of Example 1 were oxidized in an atmosphere of steam at 1350° C. for 8 hours. The oxide films thus formed had a thickness of 2.4 μm. The samples were subjected to oxygen ion implantation and heat treatment for the formation of a buried oxide film. Subsequently, the crystal layers on the buried oxide films were thinned to 25 nm. The temperature of this oxidation was set at 1200° C. Each of the samples was tested for germanium concentration in the SGOI layer by means of the SIMS. The results are shown in Table 5.

TABLE 5

Comparative Example 1

| Conditions of preoxidation | Atmosphere of steam, 1350° C., 8 hours | | | |
|---|---|---|---|---|
| Original crystal Name of sample | Crystal 1 Sample 1C | Crystal 2 Sample 2C | Crystal 3 Sample 3C | Crystal 4 Sample 4C |
| Germanium concentration in 25 nm SGOI layer | 0.4% | 2.7% | 6.9% | 11.3% |

The concentration of germanium was found to be low in spite of the use of a higher temperature and a longer time than in Example 2. The reason for this undesirable result is that owing to the very high temperature, the speed of diffusion of germanium was high enough for nearly total diffusion, and thus disappearance of germanium into the substrate.

Comparative Example 2

The wafers derived from Crystals 1-4 which could be grown without dislocation in Example 1 were oxidized in an atmosphere of steam at 1250° C. for 20 minutes. The formed oxide films had a thickness of 0.4 μm. These samples were subjected to oxygen ion implantation and heat treatment for the formation of a buried oxide film under the same conditions as mentioned above. Subsequently, the crystal layers on the buried oxide films were thinned to 25 nm. The temperature of the oxidation was set at 1200° C. After the formed oxide films were removed, each of the samples was tested for germanium concentration in the SGOI layer by means of the SIMS. The results are shown in Table 6.

TABLE 6

Comparative Example 2

| Conditions of preoxidation | Atmosphere of steam, 1250° C., 20 minutes | | | |
|---|---|---|---|---|
| Original crystal Name of sample | Crystal 1 Sample 1D | Crystal 2 Sample 2D | Crystal 3 Sample 3D | Crystal 4 Sample 4D |
| Germanium concentration in 25 nm SGOI layer | 0.4% | 2.9% | 6.9% | 12.1% |

All the samples acquired rather insufficient germanium concentrations. This is because the time of oxidation was unduly short and the concentration of germanium was low. When the germanium concentration is low during the course of pulling a crystal, the time of oxidation must be lengthened.

Comparative Example 3

The wafers derived from Crystals 1-4 which could be grown without dislocation as in Example 1 were oxidized in an atmosphere of steam at 850° C. for 4 hours. The formed oxide films had a thickness of 0.3 μm. These samples were subjected to oxygen ion implantation and heat treatment for the formation of a buried oxide film under the same conditions as mentioned above. Subsequently, the crystal layers on the buried oxide films were thinned to 25 nm. The temperature of this oxidation was set at 1200° C. Each of the samples was tested for germanium concentration in the SGOI layer by means of the SIMS. The results are shown in Table 7.

TABLE 7

Comparative Example 3

| Conditions of preoxidation | Atmosphere of steam, 850° C., 4 hours | | | |
|---|---|---|---|---|
| Original crystal Name of sample | Crystal 1 Sample 1E | Crystal 2 Sample 2E | Crystal 3 Sample 3E | Crystal 4 Sample 4E |
| Germanium concentration in 25 nm SGOI layer | 0.4% | 2.6% | 6.4% | 11.7% |

All the samples acquired insufficient germanium concentrations. This is because the temperature of oxidation was unduly low and the concentration of germanium was low. When the germanium concentration is low during the course of pulling a crystal, the temperature of oxidation must be heightened.

Comparative Example 4

The wafers derived from Crystals 1-4 which could be grown without dislocation as in Example 1 were oxidized in an atmosphere of dry oxygen at 1200° C. for 1 hour. The formed oxide films had a thickness of 0.2 μm. These samples were subjected to oxygen ion implantation and heat treatment for the formation of a buried oxide film under the same conditions as mentioned above. Subsequently, the crystal layers on the buried oxide films were thinned to 25 nm. The temperature of the oxidation was set at 1200° C. Each of the samples was tested for germanium concentration in the SGOI layer by means of SIMS. The results are shown in Table 8.

TABLE 8

Comparative Example 4

| Conditions of preoxidation | Atmosphere of steam, 1200° C., 1 hour | | | |
|---|---|---|---|---|
| Original crystal Name of sample | Crystal 1 Sample 1F | Crystal 2 Sample 2F | Crystal 3 Sample 3F | Crystal 4 Sample 4F |
| Germanium concentration in 25 nm SGOI layer | 0.3% | 2.3% | 4.3% | 5.3% |

All the samples acquired insufficient germanium concentrations. This is because the speed of oxidation was markedly low in the atmosphere of dry oxygen as compared with the speed of diffusion of germanium.

Comparative Example 5

The wafers derived from Crystals 1-3 which could be grown without dislocation as in Examples 1-5 were oxidized in an atmosphere of steam at 1250° C. for 2 hours. The formed oxide films had a thickness of 1.0 μm. These samples were subjected to oxygen ion implantation and heat treatment for the formation of a buried oxide film under the same conditions as mentioned above. Subsequently, the crystal layers on the buried oxide films were thinned to 70 nm. The temperature of oxidation was 1200° C. in the case of the wafer derived from Crystal 5 and 1100° C. in the case of the wafers derived from Crystals 6 and 7. Each of the samples was tested for germanium concentration in the SGOI layer by means of SIMS. The results are shown in Table 9.

TABLE 9

Comparative Example 5

| Conditions of preoxidation | Atmosphere of steam, 1250° C., 2 hours | | | |
|---|---|---|---|---|
| Original crystal Name of sample | Crystal 1 Sample 1G | Crystal 2 Sample 2G | Crystal 3 Sample 3G | Crystal 4 Sample 4G |
| Germanium concentration in 70 nm SGOI layer | 0.2% | 1.3% | 2.9% | 5.5% |

All the samples evidenced insufficient concentration of germanium. This is because the finally completed crystal layers had unduly large thicknesses and concentration was consequently insufficient.

Example 4

The wafers derived from Crystals 3 and 4 which were grown in Example 1 were subjected to oxygen ion implantation and heat treatment for the formation of an buried oxide film. The oxidation prior to oxygen ion implantation and removal of the oxide film were not carried out. Subsequently, the crystal layers on the buried oxide films were thinned by oxidation to 10 nm. The temperature of this oxidation was set at 1100° C. After the formed oxide films were removed with hydrofluoric acid, each of the samples was tested for germanium concentration in the SGOI film by means of SIMS. The results are shown in Table 10.

TABLE 10

| Example 4 | | |
|---|---|---|
| Original crystal | Crystal 3 | Crystal 4 |
| Name of sample | Sample 3H | Sample 4H |
| Germanium concentration in 10 nm SGOI layer | 19% | 32% |

When the germanium concentration was high during the course of pulling a crystal, an SGOI layer having a sufficiently high germanium concentration could be manufactured without performing any oxidation prior to the oxygen ion implantation.

Example 5

The wafer derived from Crystal 5 which was grown in Example 1 was oxidized in an atmosphere of steam at 1150° C. for 16 hours. The formed oxide film had a thickness of 3.1 µm as in Example 1. Subsequently, the sample was subjected to the low dose SIMOX process and the crystal layer on the buried oxide film was thinned by the ITOX process to 5 nm. When this sample was tested for germanium concentration in the thinned crystal layer, the concentration was found to be 99%. After the surface oxide film was etched, a germanium film was deposited in a thickness of 0.2 µm thereon by vapor phase deposition. When the sample was subsequently subjected to the cross section observation by TEM to determine crystallinity, it was found that the single crystal layer could be grown without dislocation.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for the production of a semiconductor substrate, comprising
    a) providing a wafer processed from a germanium doped silicon single crystal ingot having a first concentration of germanium;
    b) implanting oxygen ions into said wafer by ion implantation and heat treating to form a buried oxide film, said buried oxide film separating said wafer into a first germanium doped layer below said buried oxide film, a second layer comprising said buried oxide film, and a third germanium doped layer above said buried oxide film containing a second concentration of germanium; and
    c) thinning said third layer by thermal oxidation in an oxidizing atmosphere to enrich the concentration of germanium in said third layer to a germanium concentration higher than said second concentration.

2. The method of claim 1, wherein prior to step b), the first concentration of germanium near a surface of said wafer is increased by oxidizing the wafer in an oxidizing atmosphere at elevated temperature, followed by removal of an oxide film formed thereby.

3. The process of claim 2, wherein the oxidizing atmosphere comprises steam, said elevated temperature is from 900° C. to the melting point of the wafer, and said oxidizing is conducted for a period of minimally 30 minutes.

4. The process of claim 2, wherein said oxide film has a thickness of 1 µm or greater.

5. The process of claim 1, wherein said first concentration of germanium is from 0.05 mol percent to 5 mol percent.

6. The process of claim 1, wherein said first concentration of germanium is from 0.2 mol percent to 1 mol percent.

7. The method of claim 1, further comprising depositing a strained silicon film above said third layer by vapor phase deposition.

8. The process of claim 1, wherein the first concentration of germanium and the amount of thinning are sufficient to provide the germanium concentration in said third layer of 95 mol percent or more, further comprising depositing onto said third layer a germanium film by vapor phase deposition.

9. The method of claim 1, further comprising processing a semiconductor substrate to form semiconductor devices on the surface thereof.

10. The method of claim 1, wherein the germanium concentration in said third layer is 15 mol percent or more following thinning.

11. The method of claim 1, wherein the germanium concentration in said third layer is 99 mol percent or more following thinning.

12. The method of claim 1, further comprising
    d) etching the wafer to remove oxides formed in step c).

13. The method of claim 12, wherein the germanium concentration in said third layer is 15 mol percent or more following thinning.

14. The method of claim 12, wherein the germanium concentration in said third layer is 99 mol percent or more following thinning.

15. The method of claim 12, wherein the third layer has a thickness variation of ≦5%, or not more than 2.5 nm.

16. The method of claim 12, wherein the germanium concentration in the third layer varies by not more than 5%.

17. The method of claim 15, wherein the germanium concentration in the third layer varies by not more than 5%.

18. The method of claim 12, further comprising epitaxially depositing a layer of Ge on said third layer.

19. The method of claim 12, further comprising epitaxially depositing a strained silicon layer on said third layer.

20. The method of claim 12, wherein the thickness of said third layer, following etching, is from 1 nm to 50 nm.

* * * * *